United States Patent [19]

Zwarts

[11] Patent Number: 4,625,186

[45] Date of Patent: Nov. 25, 1986

[54] TWO-TERMINAL NEGATIVE ADMITTANCE NETWORK

[75] Inventor: Cornelis M. G. Zwarts, Gatineau, Canada

[73] Assignee: Canadian Patents and Development Limited, Ottawa, Canada

[21] Appl. No.: 725,999

[22] Filed: Apr. 22, 1985

[51] Int. Cl.[4] .................. H03H 11/00; H03H 11/08
[52] U.S. Cl. ............................... 333/216; 331/115
[58] Field of Search ............... 307/313, 322, 324; 331/115, 116 R, 117 R; 333/216, 217

[56] References Cited

U.S. PATENT DOCUMENTS 2,726,370 12/1955 Linvill et al. .................. 333/216

Primary Examiner—Eugene R. LaRoche
Assistant Examiner—James C. Lee
Attorney, Agent, or Firm—Yoshiharu Toyooka

[57] ABSTRACT

Two terminal negative admittance networks are disclosed. The preferred networks include a pair of opposite type transistors or a field-effect transistor combined with a bipolar transistor of the opposite type. These networks operate over a very wide frequency range and also can function with a very small operating current.

5 Claims, 26 Drawing Figures

TWO-TERMINAL NEGATIVE ADMITTANCE NETWORK

This invention relates to electrical networks and in particular to electrical networks including two transistors and exhibiting negative admittance characteristics.

BACKGROUND OF THE INVENTION

There have been a few patents which teach electronic circuit arrangements exhibiting negative resistance. U.S. Pat. No. 3,358,153, Dec. 12, 1957 (Poo), for example, uses a pair of bipolar transistors of the same conductivity to obtain two terminal negative resistance circuit. A positive feedback in the circuit produces a negative resistance which is essentially ohmic in nature, i.e. an equal negative resistance being developed for very low as well as high frequencies. Its behaviours are defined clearly by the static I-V curve shown in the drawings of the patent.

Canadian Pat. No. 924,390, Apr. 10, 1973 (Stanley) also teaches an electrical network having two terminals and exhibiting negative dynamic resistance characteristics. The network includes a field-effect transistor and a bipolar transistor in that the field-effect transistor controls the bias of the bipolar transistor whereby the I-V characteristics curve contains a region of negative resistance.

As in the above referenced patents, the present invention uses two active devices, e.g. bipolar junction transistors or field-effect transistors or a combination of both in its negative admittance network. However, unlike in the prior art patents, the two active devices of the present invention are always of different conductivities to each other, irrespective of the kind of active devices used.

By selecting the kinds of active devices and the choice of the various circuits components, a wide range of operating characteristics can be obtained.

OBJECT OF THE INVENTION

It is therefore a principal object of the present invention to provide new electrical network which exhibits a negative admittance.

It is another object of the present invention to provide an electrical network exhibiting a negative admittance whose characteristics are easily changed.

SUMMARY OF THE INVENTION

According to the present invention, an electrical network has a first and a second terminal and exhibits a negative admittance between the terminals. First and second electrical paths are formed in parallel between the terminals, the first path including a first and a second impedance components and the second path including a third and a fourth impedance component. The first and the fourth impedance components are connected to the first terminal and the second and the third impedance components to the second terminal. A first transistor is connected in parallel with the first impedance component and a second transistor, of the type opposite of that of the first transistor, with the third impedance component. A third electrical path including a fifth impedance component connects the first and the second transistors.

According to another aspect of the invention, the first and the second transistors are either a combination of a PNP and an NPN bipolar transistors or a combination of a bipolar transistor and an opposite type FET. The fifth impedance component is made of a capacitor and a resistor, connected in parallel to each other.

According to the further aspect of the invention, the capacitor of the fifth impedance component is a variable trimmer capacitor.

BRIEF DESCRIPTION OF THE DRAWINGS

For a more complete understanding of the present invention and for futher objects and advantages thereof, references may be made to the following description taken in conjunction with the accompanying drawings in which.

FIG. 3(b) is the ultimate equivalent circuit at one particular frequency.

DETAILED DESCRIPTION OF THE PREFERRED EMBODIMENTS

Figure 1A:
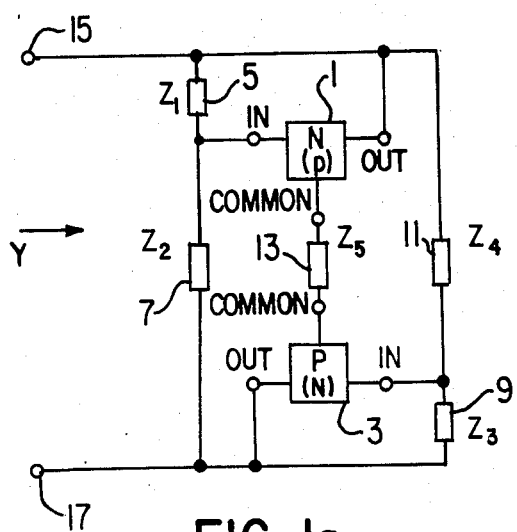
FIGS. 1(a) and 1(b) are respectively a generalized electrical network exhibiting a negative admittance according to the present invention and its equivalent circuit.

The generalized circuit diagram of a negative admittance according to the present invention, is shown in FIG. 1(a). The three terminal boxes 1 and 3 represent active devices such a bipolar transistors, junctions FET's and MOSFET's. Any combination of these active devices is possible but always a P type with an N type. The circuit components are designated by 5, 7, 9, 11 and 13. They represent resistance (including short and open circuit) and/or a capacitance and have impedance values of $Z_1$, $Z_2$, $Z_3$, $Z_4$ and $Z_5$ respectively. The operating DC voltage at terminals 15 and 17 can therefore be poistive or negative depending upon the kinds of the active devices.

Figure 1B:
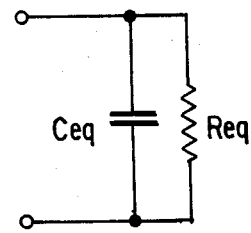

The generalized electrical network of FIG. 1(a) can ultimately be reduced, for each operating frequency, to an equivalent negative resistance, $R_{eq}$, in parallel with an equivalent capacitance, $C_{eq}$, as shown in FIG. 1(b).

Figure 2A:
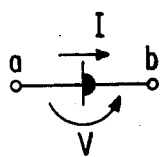
FIGS. 2(a) and 2(b) show respectively a tunnel diode and its static I-V curve.
Figure 2B:
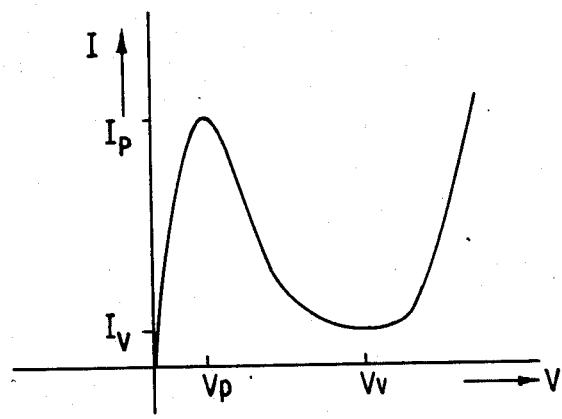
Figures 3A, 3B:
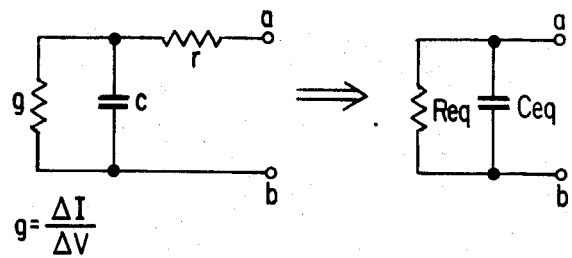
FIGS. 3(a) and 3(b) are equivalent circuits of the tunnel diode of FIG. 2(a) where
Figure 4A:
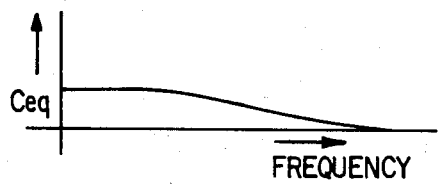
FIGS. 4(a) and 4(b) show graphs of equivalent capacitance and resistance of the tunnel diode of FIG. 2(a) plotted against the operating frequency.
Figure 4B:
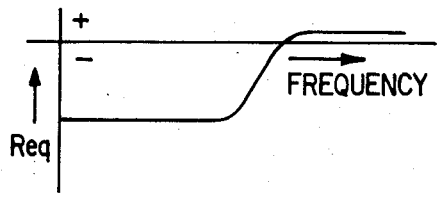

For comparison, FIGS. 2(a), (b), 3(a), (b) and 4(a), (b) give an equivalent aproach for a typical tunnel (Esaki) diode. FIG. 2 (b) gives the static I-V curve of a tunnel diode of FIG. 2(a) whereas FIG. 3(a) shows the equivalent circuit diagram. FIG. 3(b) shows the reduction to an equivalent resistance, $R_{eq}$, in parallel with an equivalent capacitance, $C_{eq}$, which are shown as a function of frequency in FIGS. 4(a), (b). The behaviour of a tunnel diode as well as the circuit arrangements in the patents mentioned earlier to Poo and Stanley, is largely determined by the static I-V curve, shown in FIG. 2(b), where it can be seen that a negative resistance, equal to $-\Delta V/\Delta I$, exists for $V_p < V < V_v$.

This direct and transparent relation between static I-V curve and dynamic negative resistance does not exist for the present invention. There is no relation between the static and dynamic behaviour of the negative admittance network. Instead, a detailed analysis has to be made of the small signal equivalent circuit to derive analytical relations for the equivalent negative resistance, $R_{eq}$, and equivalent, $C_{eq}$ as a function of the various parameters of the circuit.

Figure 5:
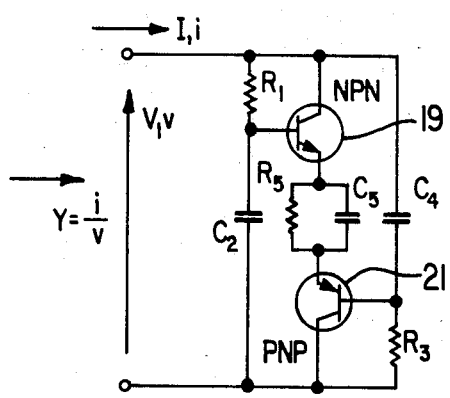
FIG. 5 is one embodiment of the present invention utilizing an NPN and PNP bipolar transistors.
Figure 12:
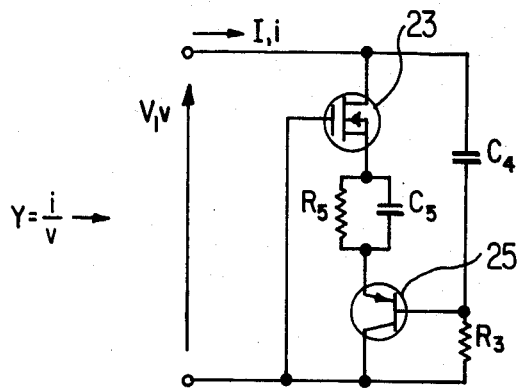
FIG. 12 is another embodiment of the present invention utilizing a depletion MOSFET and a bipolar junction transistor.

Among many possible implementations of the generalized circuit diagram, FIG. 1(a), two preferred embodiments, shown in FIGS. 5 and 12, will be analyzed here. The embodiment, shown in FIG. 5 when using microwave transistors, is especially suitable for high frequency operation. The embodiment of FIG. 12 using a depletion N-channel MOSFET and a PNP bipolar transistor will be analyzed for low and medium frequencies. Its particular advantage is that the negative admittance is independent of the DC operating voltage. Whereas the negative admittance can operate over a very large range of currents, they will be analyzed here only for very low current operation. The embodiment, shown in FIG. 5, will be analyzed operating at 25 µA's and the one FIG. 12 for 10 µA's. Negative admittances can be obtained readily however at still smaller currents.

In a tunnel diode there is one mechanism, i.e. the tunnelling effect due to overdoping—to create the voltage controlled negative resistive region in the I-V curve. In the two-terminal negative admittance, however, there are several mechanisms which contribute to the existence of a dynamic negative real part in the complex small signal admittance over a large range of frequencies.

For very low frequencies there is primarily positive feedback action via the two active devices, placed in series between the two terminals. Each terminal is connected to the opposite active device in such a way that a dynamic increase in voltage between the terminals leads to a dynamic decrease in current—hence a dynamic negative resistance effect. The two active devices have an identical and symmetrical function. In this feedback scheme there is no voltage gain, in effect the two active devices operate as unity gain emitter (source) followers. This is one of the reasons why the two-terminal device can still operate efficiently at high frequencies while being operated at very low Dc currents.

For higher operating frequencies other mechanisms become increasingly important in determining the value of the negative real part of the complex admittance.

The active devices themselves become complex networks due to increasing importance, for higher frequencies, of their small dynamic internal impedances and capacitances. This has a substantial effect on the behaviour of the two-terminal negative admittance.

The transit time delay of the charge carriers diffusing across the base region not only plays a very important role at very high frequencies by it is already very effective at the medium frequencies. This transit time delay effect has a pronounced effect on the magnitude of the real part, $R_{eq}$, of the complex admittance.

The complex impendance $Z_5$ placed between the two active devices shown in FIG. 1(a) also has a large influence on the negative admittance. In effect, the small parallel capacitor, $C_5$, shown in FIG. 5 even when it is reduced to its strictest possible minimum, i.e. the inherent stray capacitance of the resistance $R_5$ also shown in FIG. 5 plays a very important role in extending and substantially improving the negative admittance behaviour for higher operating frequencies.

Turning now to FIG. 5 more closely, there is shown one of the preferred embodiments according to the present invention.

In FIG. 5, a pair of an N type and a P type bipolar transistors 19 and 21 are employed in the network. Also capacitors and resistors are used an impedance elements. It should be noted that $Z_5$ is made of a capacitor $C_5$ and a resistor $R_5$ of which the capacitor $C_5$ can be formed by a variable trimmer capacitor. Therefore the following impedance values are applicable:

$Z_1 = R_1$ $Z_2 = 1/j\omega C_2$ $Z_3 = R_3$ $Z_4 = 1/j\omega C_4$ $Z_5 = R_5/1 + j\omega R_5 C_5)$ Because of the presence of the capacitors in the network, a distinction must be made for the low frequency and high frequency operations.

Figure 6:
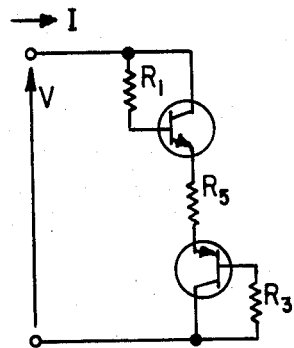
FIGS. 6 and 7 are respectively an equivalent circuit of the embodiment of FIG. 5 for low frequency operations and its static I-V curve.
Figure 7:
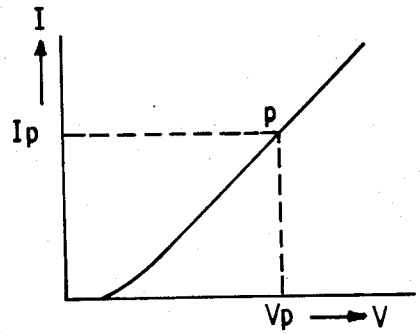

At low frequencies, $C_2$ and $C_4$ in FIG. 5 have reactance values considerably larger than their respective series resistance $R_1$ and $R_3$. The equivalent circuit for the low frequency operation and I-V behaviour are shown in FIGS. 6 and 7. As seen in FIG. 7, the quasi-static I-V curve does not have any negative slope, hence there is no negative resistance. In the figure, a point p at $V_p$ and $I_p$ indicates the operating point of the network. However at higher frequencies for which the reactance values of $C_2$ and $C_4$ are considerably smaller than their respective series resistors $R_1$ and $R_3$, the situation is rather different. The equivalent small signal high frequency model is shown in FIG. 8. It takes into account interelectrode and parasitic capacitances as well as the charge carrier diffusion delay time through the base regions to reflect into the model the very high frequency effects. It is assumed that the transistors are symmetrical in the characteristics.

Figure 8A:
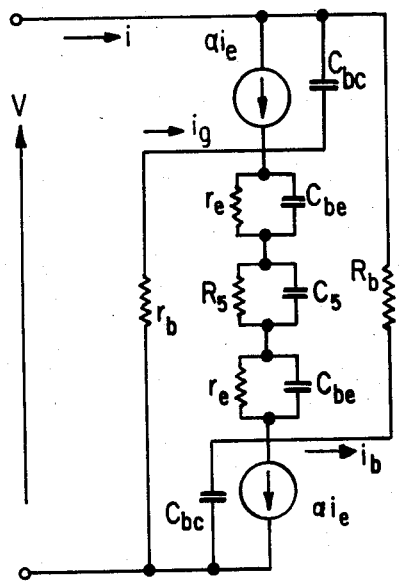
FIGS. 8(a) and (b) are equivalent circuits of the embodiment of FIG. 5 for high frequency operations, FIG. 8(a) being for mathematical treatments and FIG. 8(b) being an ultimate equivalent circuit at a particular frequency.

In FIG. 8(a) interelectrode and parasitic capacitances are $C_{bc}$ and $C_{be}$. Emitter resistance and base resistances are $r_e$ and $r_b$.

The collector emitter current ratio, $\alpha$, is taken complex, $$\alpha = \alpha_{re} - j\alpha_{im} = \frac{\alpha_0}{1 + j\frac{1.7f}{f_T}}$$

to account for the transit delay of the charge carriers across the base region at high frequencies.

Figure 8B:
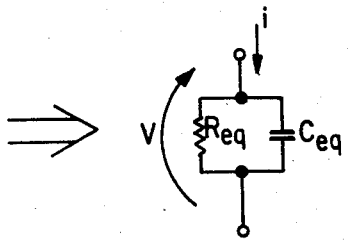

FIG. 8(b) shows an ultimately simplified equivalent circuit wherein $R_{eq}$ and $C_{eq}$ designate equivalent resistance and equivalent capacitance. The admittance Y of the network shown in FIG. 5 at an operating frequency $\omega$ will be expressed as $$Y = i/v = 1/R_{eq} + j\omega C_{eq}$$

From the high frequency model one can derive for the admittance Y as follows:

$$Y = \frac{AB + jB}{K + jL} = \frac{AK + BL}{K^2 + L^2} + j\frac{BK - AL}{K^2 + L^2} = \frac{1}{R_{eq}} + j\omega C_{eq} \text{ hence}$$

$$R_{eq} = \frac{K^2 + L^2}{AK + BL} \text{ and } C_{eq} = \frac{BK - AL}{\omega(K^2 + L^2)} \text{ where}$$

$$A = [1 - 2\alpha_{re} - 2\omega\alpha_{im}(r_e C_{be} + R_5 C_5) -$$

$$\omega^2\{1 - 2\alpha_{re})r_e R_5 C_{be} C_5 +$$

$$r_b C_{bc}(r_e C_{be} + R_5 C_5) + 2C_{bc}r_e R_5(C_{be} + 2C_5)\}]$$

$$B = [2\alpha_{im}(1 - \omega^2 r_e R_5 C_{be} C_5) + \omega\{(1 - 2\alpha_{re})(r_e C_{be} + R_5 C_5) +$$

$$r_b C_{bc}(1 - \omega^2 r_e R_5 C_{be} C_5) + 2C_{bc}(2r_e + R_5)\}]$$

$$K = [2r_e + R_5 + 2(1 - \alpha_{re})r_b - 2\omega\alpha_{im}r_b(r_e C_{be} + R_5 C_5) -$$

$$\omega^2 r_b r_e R_5\{2(1 - \alpha_{re})C_{be} C_5 + C_{bc}(C_{be} + 2C_5)\}]$$

$$L = [2\alpha_{im}r_b(1 - \omega^2 r_e R_5 C_{be} C_5) +$$

$$\omega\{2(1 - \alpha_{re})r_b(r_e C_{be} + R_5 C_5) +$$

$$r_b C_{bc}(2r_e + R_5) + R_e R_5(C_{be} + 2C_5)\}]$$

The high frequency model and the expressions above, derived with it, allows one to analyse the small admittance around a particular operating point P in FIG. 7 for a variety of circuit parameters and conditions, and in particular show that a negative input conductance $D = 1/R_{eq}$ is created.

Figure 9A:
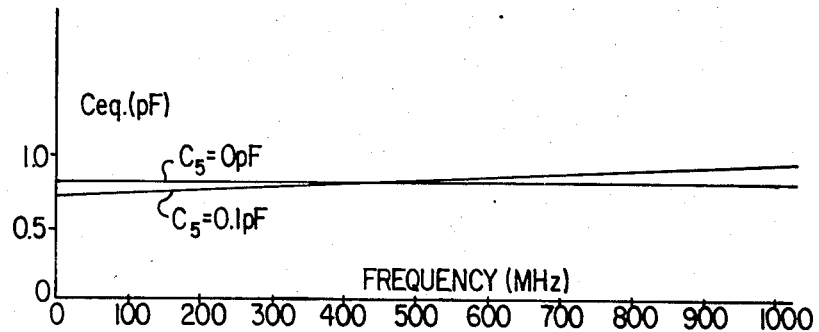
FIGS. 9(a), (b), 10(a), (b) and 11(a) and (b) show graphs of equivalent capacitance and resistance of the embodiment shown if FIG. 5, plotted against the operating frequency, where one of the capacitors and the unity current gain frequency are variable.
Figure 9B:
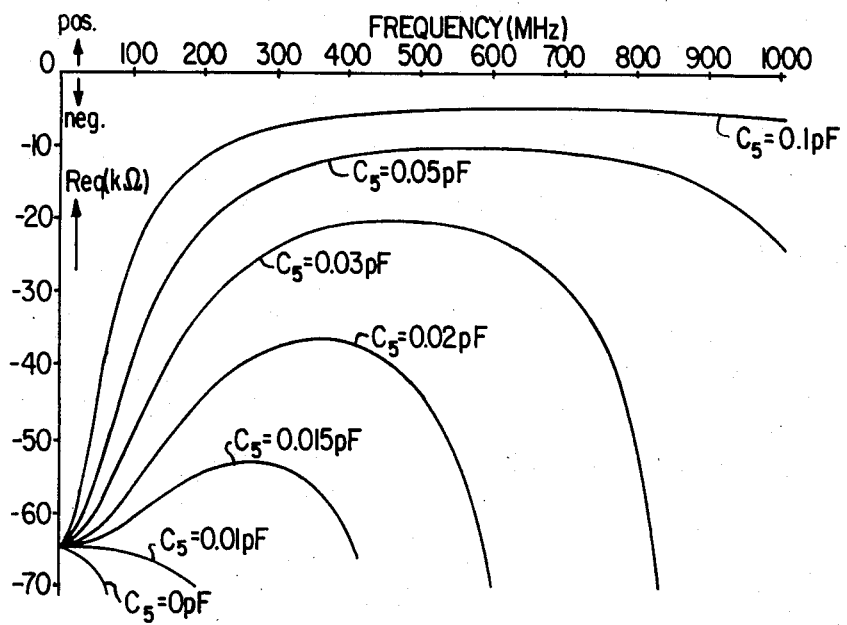

FIGS. 9(a), (b), 10(a), (b), and 11(a), (b) illustrate the behaviour of the small signal admittance. They have been derived with the following values for the various parameters in the equivalent circuit model: $\alpha_o = 0.98$; $f_T = 750$ MHz (FIGS. 9(a) (b) and 11(a), (b)); $r_b = 10$ ohms; $r_e = 1000$ ohm; $R_5 = 60$ Kohms; $C_{be} = 1$pF; $C_{bc} = 0.4$ pF; $C_5 = 0.1$pF (FIGS. 10(a), (b)).

In FIGS. 9(a), (b) are shown the small signal negative equivalent resistance $R_{eq}$ and capacitance, $C_{eq}$, of the admittance as a function of the operating frequency f and $C_5$ as a variable parameter. It clearly demonstrates the important role played by the reactive part, $\omega C_5$, of the impedance $Z_5$, to create a negative resistance over a very large frequency range. Compare for that purpose the curve with $C_5 = 0$ and $C_5 = 0.1$ pF. The negative resistance, at $f=0$, represents the negative resistance created by the positive feedback action above.

Figure 10A:
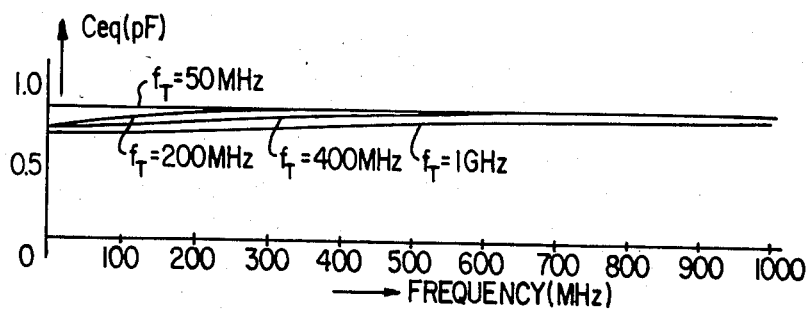
Figure 10B:
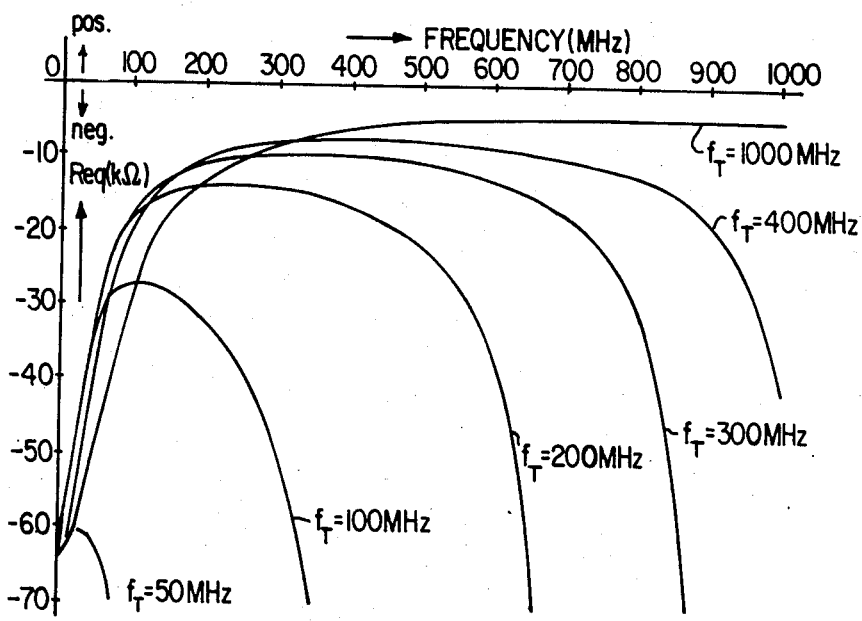
Figure 11A:
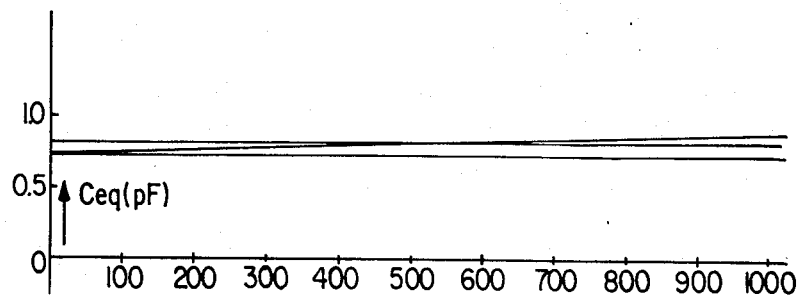

FIGS. 10(a) and (b) illustrate the behaviour of the negative admittance as a function of the unity current gain frequency, $f_T$. This frequency, $f_T$, is principally a function of the transit time delay effect across the base region. Notice in FIGS. 10(a), (b) that a negative resistance is created for frequencies way beyond $f_T$, hence for current gains less than unity. With a current gain less than unity in the circuit it is impossible to create a negative resistance by positive feedback action, indicating clearly therefore that other mechanisms, such as the transit time delay for instance, are responsible for the existence of a negative resistance at higher frequencies. FIGS. 11(a), (b) illustrate that it is actually the combination of the influence of $C_5$ and the transit time effect (via $f_T$) which is important in creating a useful negative resistance over a large frequency range.

Figure 11B:
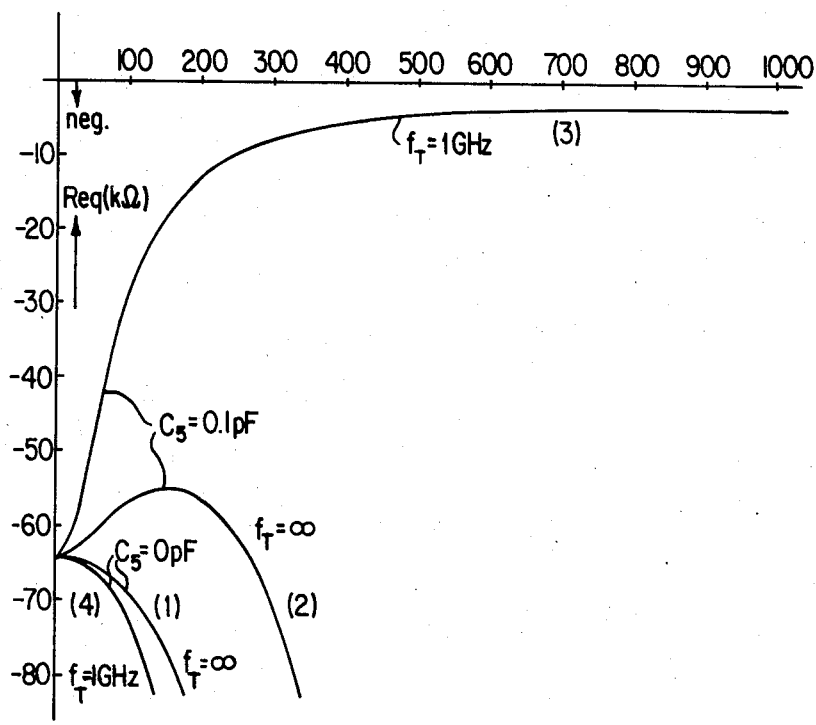

Curve (1) in FIG. 11(b) is the starting point for the discussion. The assumptions are that $f_T = \infty$ (i.e. transit delay=0) and $C_5 = 0$. Curve (2) shows the improvement obtained in the magnitude as well as the frequency range of the negative resistance, $R_{eq}$, when $C_5$ allows to have a very small value of 0.1 pF. Curve (3) indicates the very substantial improvement obtained in the useful frequency range for the equivalent negative resistance, $R_{eq}$, relative to curve (2), when a small transit time delay is introduced in the equivalent circuit model, $f_T = 1$ GHz. However, starting again from curve (1) and now including again a small transit time effect but keeping $C_5 = 0$, one notices a deterioration in performance, as shown by curve (4). Hence the transit time effect by itself detrimental to the useful frequency range; however, when combined with a small value for $C_5$, it becomes very useful, hence a combinational effect. This is very evident by an inspection of the curves in FIGS. 11(a) and (b).

Figure 13:
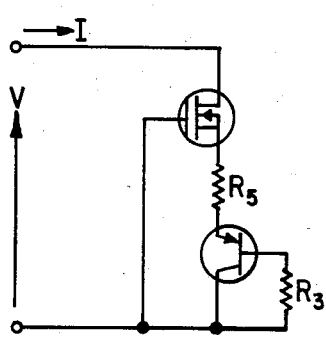
FIGS. 13 and 14 are respectively an equivalent circuit and its static I-V curve of the embodiment shown in FIG. 12 for low fequency operations.

Turning now to FIG. 12 another preferred embodiment is shown using a field-effect transistor and a bipolar junction transistor. In this figure, a P type bipolar transistor 25 is used with an N-channel depletion MOSFET 23 (or an N-channel junction FET). Impedance components are capacitors and resistors as shown in the figure. As in FIG. 5, it should be noted that $Z_5$ is made of a capacitor $C_5$ and a resistor $R_5$ of which the capacitor $C_5$ can be formed by a variable trimmer capacitor. All the impedance components have values as follows:

$Z_1 = \infty$ $Z_2 = 0$ $Z_3 = R_3$ $Z_4 = 1/j\omega C_4$ $Z_5 = R_5/1 + j\omega R_5 C_5$ Again distinction should be made for low and high frequency operations. For low frequency and DC operations $C_4$ and $C_5$ have reactance much larger than $R_3$ and $R_5$ and thus the network can be expressed in a static equivalent circuit shown in FIG. 13 and its static I-V curve is in FIG. 14 with P indicating the operating point.

Figure 14:
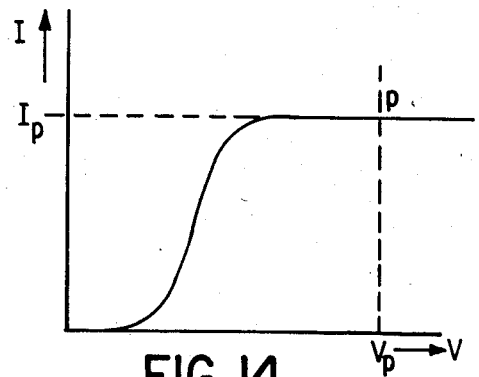

As seen in FIG. 14, the current I is virtually constant once the voltage V passe beyond a certain threshold value. The quasi-static I-V curve of the figure indicates everywhere a positive slope, hence there is no negative resistance being developed for low frequencies.

The situation is rather different for frequencies for which the reactance of $C_4$ becomes much smaller than the series resistance $R_3$. The equivalent small signal high frequency model is shown in FIGS. 15(a) and (b).

Figure 15A:
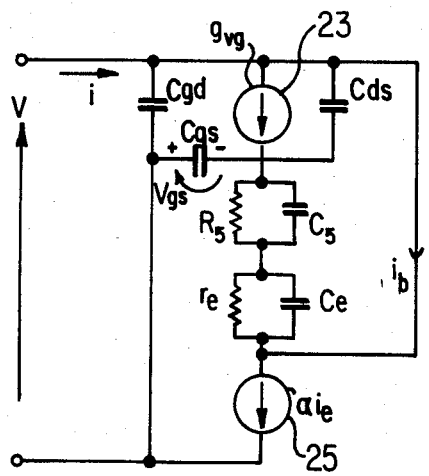
FIGS. 15(a) and 15(b) are equivalent circuits of the embodiment shown in FIG. 12 for high frequency operations, FIG. 15(a) being for mathematical treatments and FIG. 15(b) being an ultimate equivalent circuit at a particular frequency.
Figure 15B:
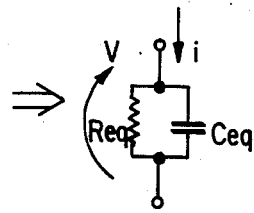

In FIG. 15(a), $r_e$ and $C_e$ are emitter resistance and capacitance of the bipolar transistor 25. $C_{gd}$, $C_{ds}$ and $C_{gs}$ are interelectrode capacitances such as between gate-drain, drain-source and gate-source respectively of the MOSFET 23. A voltage difference between the gate and source is shown by Vgs and the gate voltage of the MOSFET and the emitter current of the bipolar transistor Vgs and and $i_e$ respectively. As in the previous figure, $\alpha$ is the collector emitter curent ratio of the bipolar transistor. g is the transconductance of MOSFET. FIG. 15(b) shows the simplifed equivalent circuit indicating the equivalent resistance $R_{eq}$ and the equivalent capacitance $C_{eq}$ at one particular frequency.

Consequently the input admittance Y is defined as follows:

$$Y = i/v = 1/R_{eq} + j\omega C_{eq}$$

Let Y be expressed as follows:

$$Y = \frac{A + jB}{K + jL} = \frac{AK + BL}{K^2 + L^2} + j\frac{BK - AL}{K^2 + L^2}$$

Consequently from the above equations, we obtain $$R_{eq} = \frac{K^2 + L^2}{AK + BL}$$

$$C_{eq} = \frac{BK - AL}{\omega(K^2 + L^2)}$$

Parameters A, B, K and L are expressed as follows:

$$A = -\alpha g - \omega^2[-\alpha g r_e R_5 C_e C_5 + (1-\alpha)C_{gs}(-r_e C_e + R_5 C_5) +$$

$$(r_e + R_s)C_{gs}C_{ds}]$$

$$B = -\omega[-(1-\alpha)C_{gs} + \alpha g(r_e C_e + R_5 C_5) +$$

$$\omega^2 r_e R_5 C_{gs}\{(1-\alpha)C_e C_5 + C_{ds}(C_e + C_5)\}]$$

$$K = 1 + g(r_e + R_5) - \omega^2 r_e R_5\{C_e C_5 + (C_e + C_5)(C_{gs} + C_{ds})\}$$

$$L = \omega[r_e C_e + R_5 C_5 + g r_e R_5(C_e + C_5) + (r_e + R_5)(C_{gs} + C_{ds})]$$

The high frequency model and the expressions above derived from it, allow one to analyse the small signal admittance around a particular operation point P for a variety of circuit parameters and conditions and in particular show that a negative input conductance $G = 1/R_{eq}$ is created.

Figure 16A:
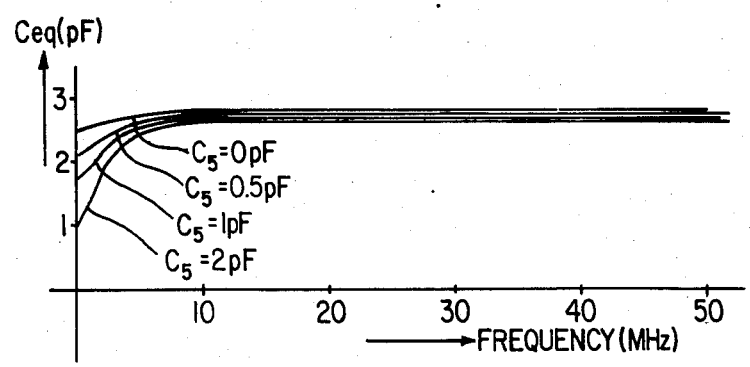
FIGS. 16(a) and 16(b) show graphs of equivalent capacitance and resistance of the embodiment shown in FIG. 12, plotted against the operating frequency, where one of the capacitors is variable.
Figure 16B:
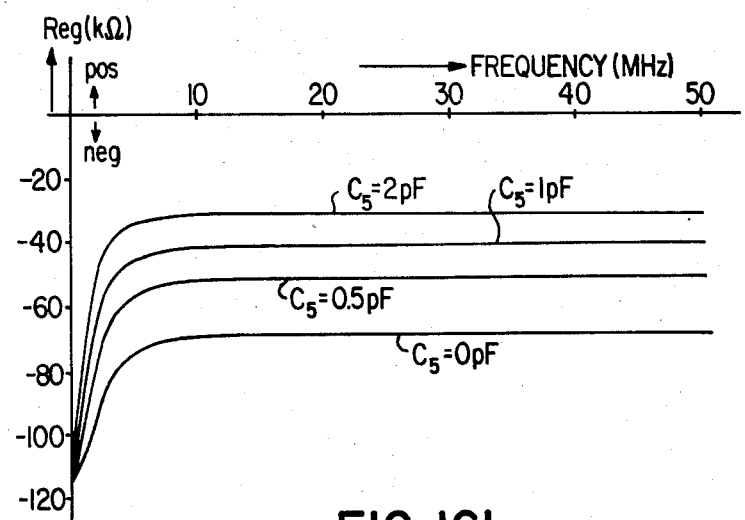

A typical behaviour of the equivalent resistance $R_{eq}$ and equivalent capacitance $C_{eq}$ as a function of frequency f, with $C_5$ as a variable parameter is shown in FIG. 16. The MOSFET 23 is 3N141 and the bipolar transistor 25 is 2N3640.

TYPICAL APPLICATIONS FOR TWO-TERMINAL NEGATIVE ADMITTANCE NETWORK

The most obvious application for the "two terminal negative admittance" is that of oscillators, where the negative admittance is put in series with a suitable resonance circuit.

An important specific area of application is that of marginal oscillator measuring schemes.

A marginal oscillator is characterized by the feature that its amplitude compliance coefficient is very large. Therefore, minute changes of parameters, which can be coupled into the oscillator via the magnetic field of its inductor or the electric field of its capacitor, can readily change the amplitude of the oscillator.

This specialized measuring scheme, using marginal oscillators, can be made very sensitive.

For example, a marginal oscillator detection scheme is used to measure minute changes in the magnetic susceptibility, of a sample placed inside the coil, in nuclear spin resonance spectrometers.

Other examples of marginal oscillator measuring schemes are: grip dip meters, metal detectors, measuring changes in the dielectric filling of the capacitor.

The "two terminal negative admittance" is very suitable for marginal oscillator measuring schemes, primarily for two reasons:

(1) the negative conductance can readily be adjusted to just barely overcome the internal losses of the resonance circuit.

(2) the non-linearity in the negative conductance can be kept very small as well as smooth, for small amplitudes of oscillation.

This results in a very large amplitude compliance coefficient, typical for marginal oscillators.

I claim:

1. An electrical network having a first and a second terminals and exhibiting a negative admittance between the terminals comprising:

a first electrical path between the terminals including a first and a second impedance components $Z_1$ and $Z_2$ respectively, connected in series to each other, a second electrical path between the terminals in parallel to the first path including a third and a fourth impedance components $Z_3$ and $Z_4$ respectively connected in series to each other, $Z_1$ and $Z_4$ being connected to the first terminal and $Z_2$ and $Z_3$ to the second terminal, a first transistor connected in parallel with the first impedance component $Z_1$, a second transistor of the type different from that of the first transistor connected in parallel with the third impedance component $Z_3$ and a third electrical path including a fifth impedance component $Z_5$ and connecting the first and the second transistors.

2. The electrical network according to claim 1, wherein the first transistor is an NPN type bipolar junction transistor and the second transistor is a PNP type bipolar junction transistor, the first and the third impedance components $Z_1$ and $Z_3$, are resistors, the second and the fourth impedance components $Z_2$ and $Z_4$ are capacitors, and the fifth impedance component $Z_5$ is made of a capacitor and a resistor coupled in parallel to each other.

3. The electrical network according to claim 1 wherein the first transistor is a field-effect transistor and the second transistor is a bipolar junction transistor, the first impedance component $Z_1$ is an open circuit, the second impedance component $Z_2$ is a shorted circuit,
the third impedance component $Z_3$ is a resistor,
the fourth impedance component $Z_4$ is a capacitor, and
the fifth impedance component $Z_5$ is made of a capacitor and a resistor coupled in parallel to each other.

4. The electrical network according to claim 2 wherein,
the capacitor of the fifth impedance component $Z_5$ is a variable capacitor.

5. The electrical network according to claim 3 wherein
the first transistor is of a type selected from a group consisting of an N-channel depletion MOSFET and an N-channel junction FET and
the capacitor of the fifth impedance component $Z_5$ is a variable capacitor.

* * * * *

UNITED STATES PATENT AND TRADEMARK OFFICE
CERTIFICATE OF CORRECTION

PATENT NO. : 4,625,186
DATED : Nov. 25, 1986
INVENTOR(S) : Cornelis M.G. Zwarts

It is certified that error appears in the above-identified patent and that said Letters Patent are hereby corrected as shown below:

Column 2, line 38, "if" should read "in";

Column 2, line 62, "a" should read "as";

Column 4, line 43, in the equation dealing with $Z_5$, an open bracket should be placed between "/" and "1";

Column 5, line 51, "D" should read "G";

Column 7, lines 37, 46 and 49, in the equations dealing with A, K and L, respectively, "-" should be deleted at the end of the first line of each equation.

Signed and Sealed this

Third Day of March, 1987

Attest:

DONALD J. QUIGG

Attesting Officer

Commissioner of Patents and Trademarks